United States Patent
Chen

(10) Patent No.: US 11,289,458 B2
(45) Date of Patent: Mar. 29, 2022

(54) MICRO LIGHT-EMITTING DIODE TRANSPARENT DISPLAY

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

(*) Notice: Subject to any disclaimer, the term of this patent is extended or adjusted under 35 U.S.C. 154(b) by 0 days.

(21) Appl. No.: 16/529,728

(22) Filed: Aug. 1, 2019

(65) Prior Publication Data

US 2021/0035958 A1   Feb. 4, 2021

(51) Int. Cl.
*H01L 25/075* (2006.01)
*H01L 27/32* (2006.01)

(52) U.S. Cl.
CPC ...... *H01L 25/0753* (2013.01); *H01L 27/3213* (2013.01); *H01L 27/3216* (2013.01); *H01L 27/3218* (2013.01); *G09G 2300/0452* (2013.01)

(58) Field of Classification Search
CPC ............. H01L 25/0753; H01L 27/3218; H01L 27/3213; H01L 27/3216; G09G 2300/0452
See application file for complete search history.

(56) References Cited

U.S. PATENT DOCUMENTS

| | | | | |
|---|---|---|---|---|
| 2002/0130326 A1* | 9/2002 | Tamura | .................... | F21K 9/00 257/79 |
| 2004/0208210 A1* | 10/2004 | Inoguchi | ............... | H01L 33/486 372/36 |
| 2004/0239243 A1* | 12/2004 | Roberts | ..................... | F21V 5/02 313/512 |
| 2005/0157515 A1* | 7/2005 | Chen | ..................... | H05B 45/24 362/555 |
| 2006/0157724 A1* | 7/2006 | Fujita | ..................... | B29C 39/10 257/99 |
| 2009/0146159 A1* | 6/2009 | Park | .................. | G02F 1/133606 257/93 |
| 2009/0168419 A1* | 7/2009 | Daimon | ................. | F21V 5/043 362/235 |
| 2010/0117100 A1* | 5/2010 | Ogawa | .................... | F21V 21/30 257/88 |
| 2011/0058372 A1* | 3/2011 | Lerman | ................ | H05K 1/0204 362/235 |
| 2012/0286301 A1* | 11/2012 | Kobayakawa | ...... | H01L 25/0753 257/88 |
| 2016/0056204 A1* | 2/2016 | Sakariya | ............... | H01L 27/124 257/88 |

(Continued)

*Primary Examiner* — Feifei Yeung Lopez
(74) *Attorney, Agent, or Firm* — CKC & Partners Co., LLC

(57) ABSTRACT

A micro light-emitting diode transparent display including a transparent substrate is provided. N pixels are defined on the transparent substrate. N sets of micro light-emitting diodes are on the transparent substrate and respectively located in the N pixels. A wall portion is on the transparent substrate and surrounding one of the N sets of the micro light-emitting diodes to form an enclosed region on the transparent substrate. A length of a periphery of the enclosed region is equal to or smaller than 85% of a length of an outer periphery of one of the N pixels in which said one of the N sets of the micro light-emitting diodes is located. An area of said one of the N pixels outside the enclosed region allows light to directly pass through the micro light-emitting diode transparent display.

10 Claims, 8 Drawing Sheets

(56) References Cited

U.S. PATENT DOCUMENTS

| | | | |
|---|---|---|---|
| 2017/0263828 A1* | 9/2017 | Mao | H01L 33/62 |
| 2020/0135991 A1* | 4/2020 | Lin | F21K 9/66 |
| 2021/0095833 A1* | 4/2021 | Lee | F21V 9/30 |

* cited by examiner

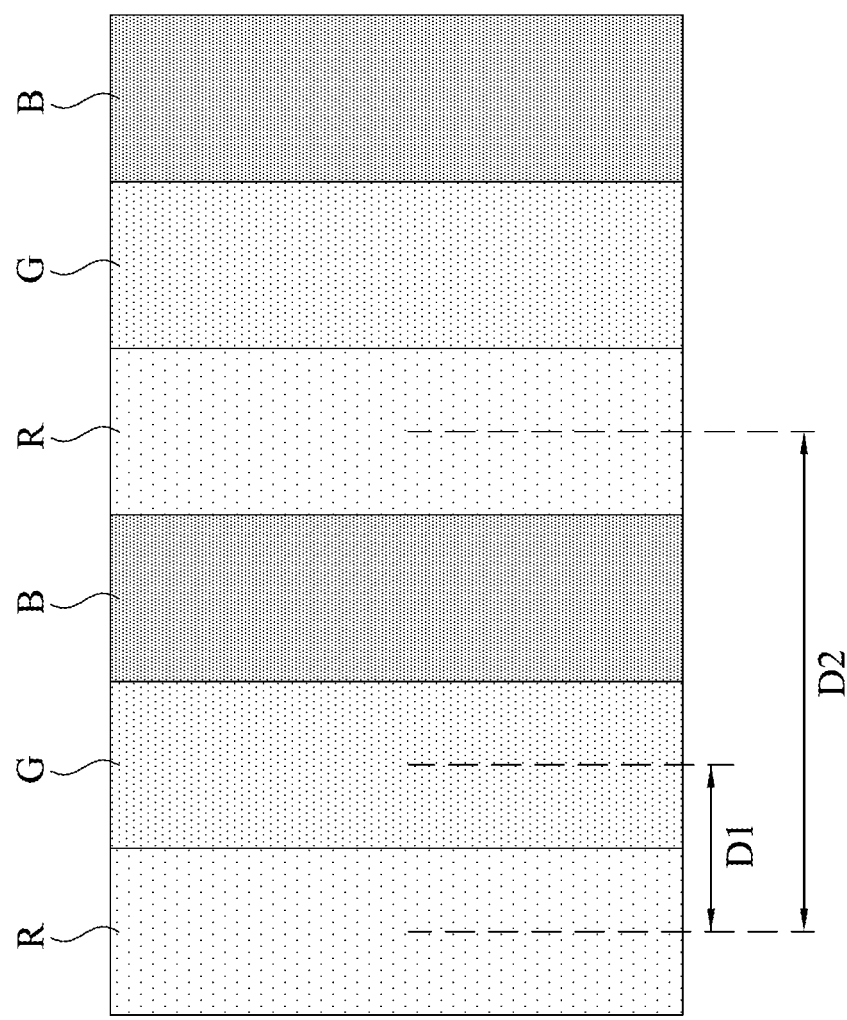

MICRO LIGHT-EMITTING DIODE TRANSPARENT DISPLAY

BACKGROUND

Field of Invention

The present disclosure relates to a micro light-emitting diode transparent display.

Description of Related Art

The statements in this section merely provide background information related to the present disclosure and do not necessarily constitute prior art.

Over the past decades, display technology has flourished. Many new types and improvements in displays continue to be introduced to the world. Among them, transparent displays of different types are known as one of the promising types of displays. Transparent displays can let images appear floated in the air compared to traditional displays where images appear on a visible screen. Transparent displays may have widespread applications from household window displays to vehicle window displays without blocking the driver's view.

A number of transparent display technologies exist. Liquid crystal displays (LCD) can be made transparent by changing the design of the light source, but their transparency is still not high enough. Organic light-emitting diodes (OLEDs) can also be made transparent, but the production is costly. More research and development are needed to develop displays that are more transparent and cost effective.

SUMMARY

According to some embodiments of the present disclosure, a micro light-emitting diode transparent display including a transparent substrate, N pixels, N sets of micro light-emitting diodes, and a wall portion is provided. The N pixels are defined on the transparent substrate, and N is a positive integer. The N sets of the micro light-emitting diodes are on the transparent substrate and respectively located in the N pixels. Each of the N sets of the micro light-emitting diodes has at least one micro light-emitting diode. The wall portion is on the transparent substrate and surrounds one of the N sets of the micro light-emitting diodes to form an enclosed region on the transparent substrate. A length of a periphery of the enclosed region is equal to or smaller than 85% of a length of an outer periphery of one of the N pixels in which said one of the N sets of the micro light-emitting diodes is located. An area of said one of the N pixels outside the enclosed region allows light to directly pass through the micro light-emitting diode transparent display.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 5C is a schematic top view of two adjacent pixels of a conventional display.

DETAILED DESCRIPTION

Figure 1A:
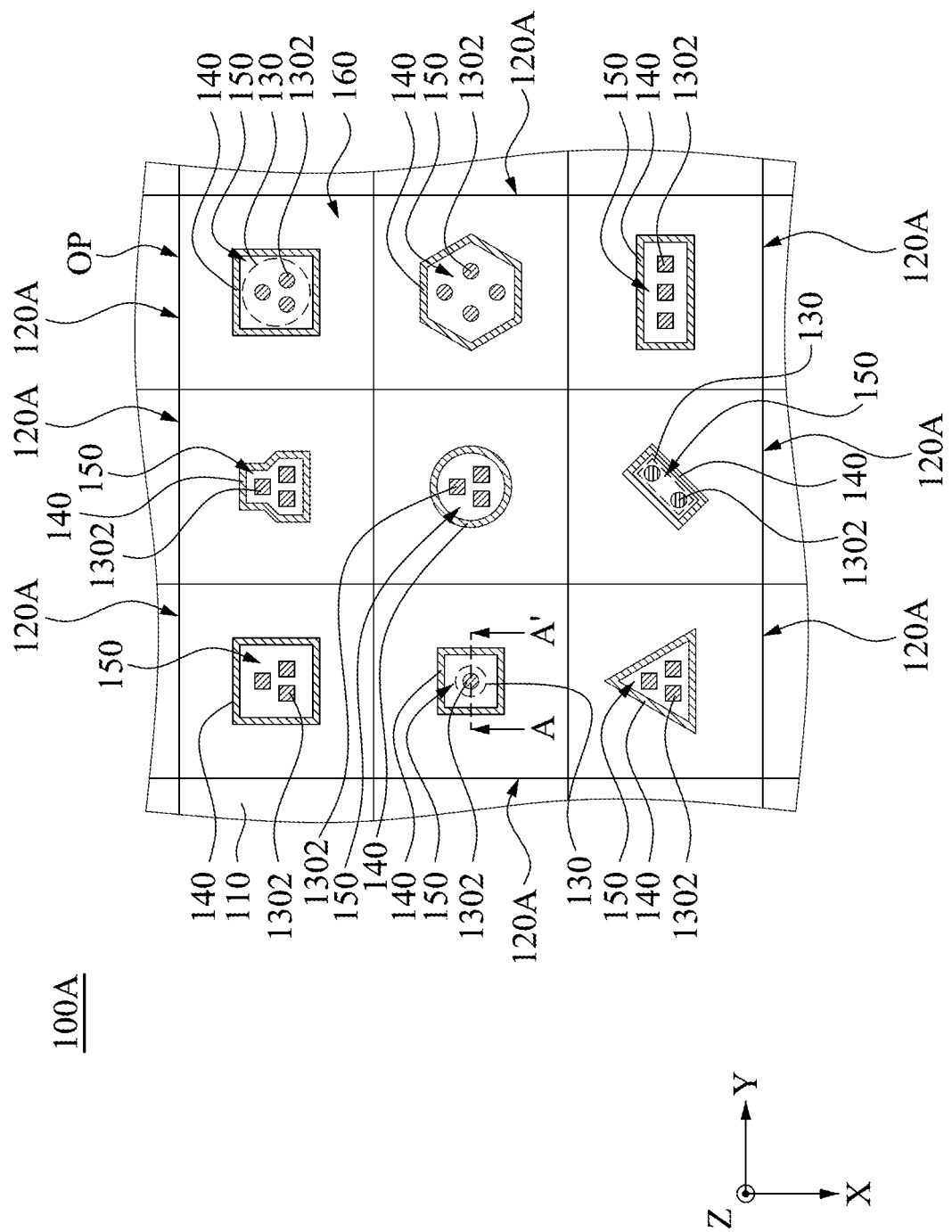
FIG. 1A is a schematic top view of a micro light-emitting diode transparent display according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1B:
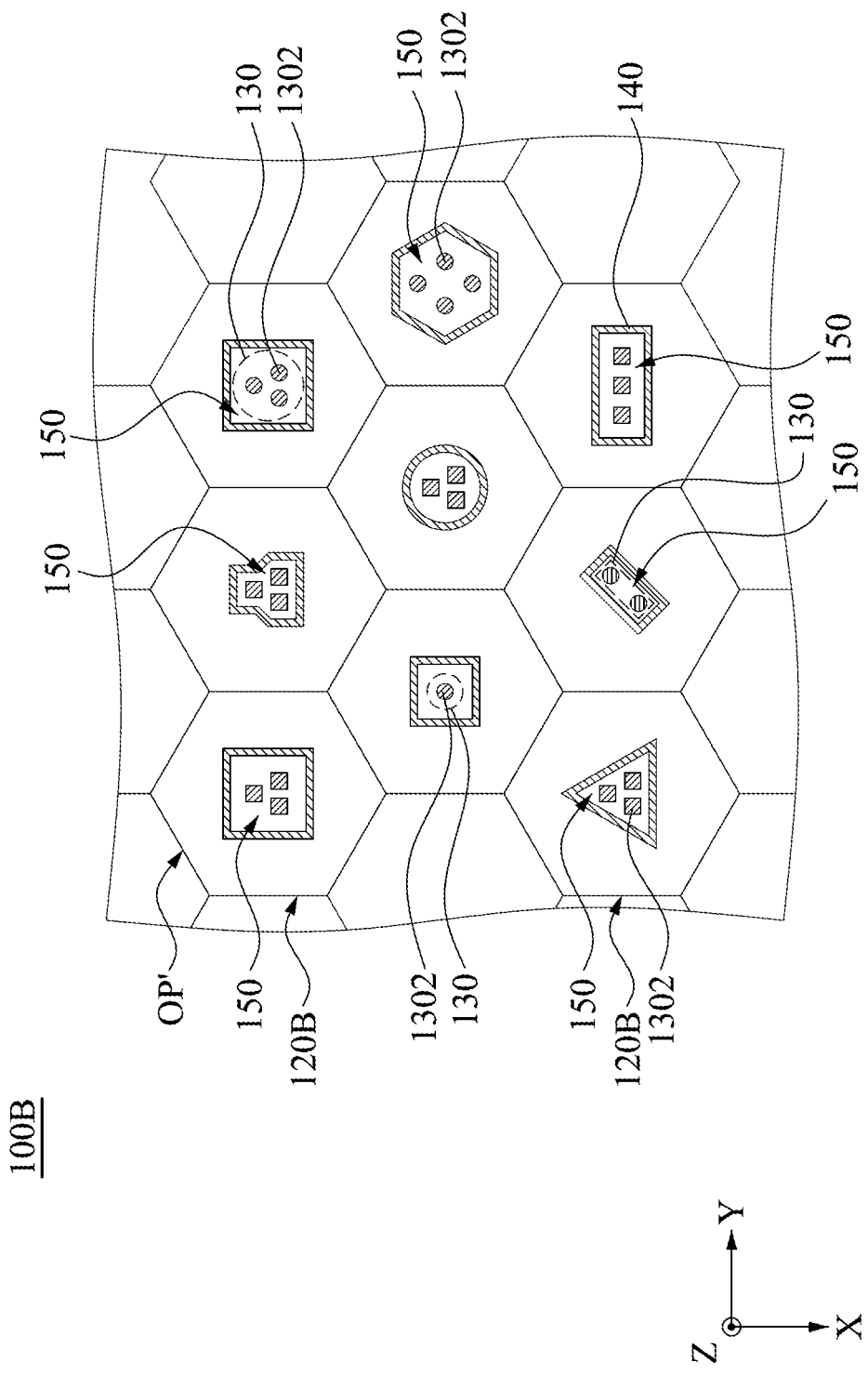
FIG. 1B is a schematic top view of a micro light-emitting diode transparent display according to some embodiments of the present disclosure.
Figure 2B:
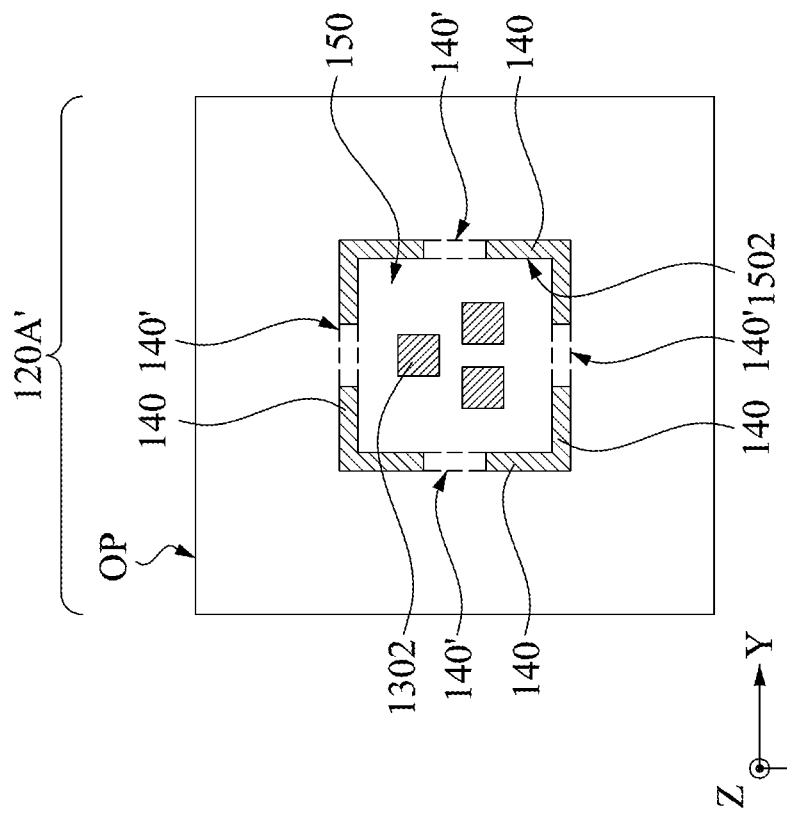
FIG. 2B is a schematic top view of one pixel of the micro light-emitting diode transparent display according to some embodiments of the present disclosure.
Figure 2A:
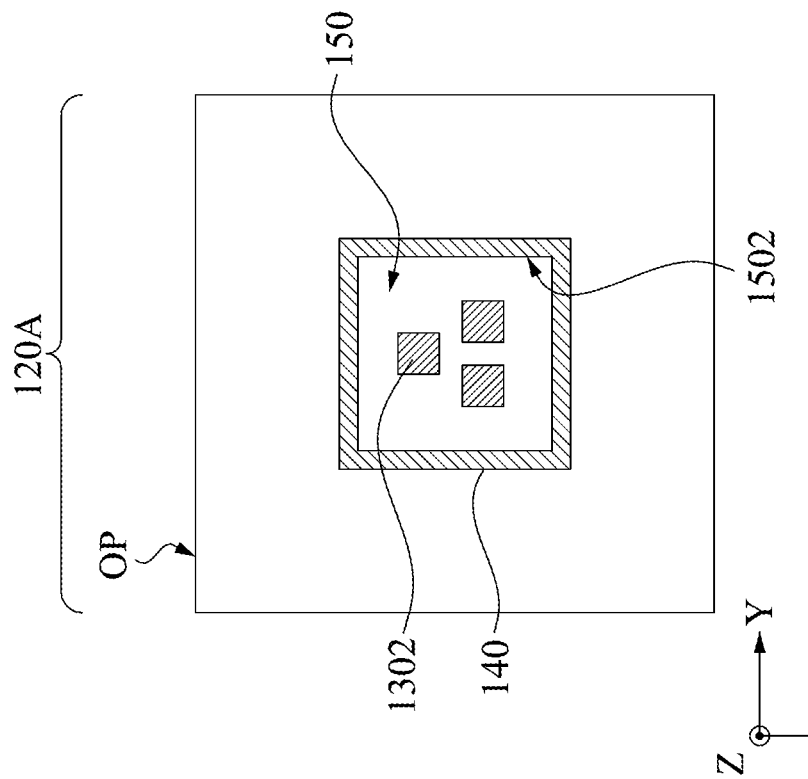
FIG. 2A is a schematic top view of one pixel of the micro light-emitting diode transparent display according to some embodiments of the present disclosure.

Reference is made to FIGS. 1A to 2B. FIG. 1A is a schematic top view of a micro light-emitting diode transparent display 100A according to some embodiments of the present disclosure. FIG. 1B is a schematic top view of a micro light-emitting diode transparent display 100B according to some embodiments of the present disclosure. FIG. 2A is a schematic top view of one pixel 120A of the micro light-emitting diode transparent display 100A according to some embodiments of the present disclosure. FIG. 2B is a schematic top view of one pixel 120A' of the micro light-emitting diode transparent display 100A according to some embodiments of the present disclosure. In some embodiments, a micro light-emitting diode transparent display 100A includes a transparent substrate 110, N pixels 120A (see FIG. 1A), N sets 130 of micro light-emitting diodes 1302, and at least one wall portion 140. The N pixels 120A are defined on the transparent substrate 110, and N is a positive integer. N can be in an order of million. However, since most of the pixels in one display are repeated in structure, in the present disclosure only nine pixels or less with micro light-emitting diodes 1302 therein are shown in figures for simplicity. The N sets 130 of the micro light-emitting diodes 1302 are on the transparent substrate 110 and respectively located in the N pixels 120A. Each of the N sets 130 of the micro light-emitting diodes 1302 has at least one micro light-emitting diode 1302. The wall portion 140 is on the transparent substrate 110 and surrounds one of the N sets 130 of the micro light-emitting diodes 1302 to form an enclosed region 150 on the transparent substrate 110. The wall portion 140 forms the enclosed region 150 in an X-Y plane. The enclosed region 150 can be substantially transparent or opaque. Normally, the wall portion 140 does not surround the set 130 of the micro light-emitting diodes 1302 from a direction along Z-axis. In some practical applications, each of the N pixels 120A has one wall portion 140 and one set 130 of the micro light-emitting diodes 1302 therein.

A length of a periphery 1502 (see FIG. 2A) of the enclosed region 150 is equal to or smaller than 85% of a length of an outer periphery OP of one of the N pixels 120A in which said one of the N sets 130 of the micro light-emitting diodes 1302 is located. The periphery 1502 corresponds to the inner side surface of the wall portion 140. Specifically, the enclosed region 150 as mentioned can be an area enclosed by one wall portion 140 within one of nine pixels 120A (e.g., the pixel 120A in the upper right corner as shown in FIG. 1A, but should not be limited thereto). Said one of the nine pixels 120A has one set 130 of the micro light-emitting diodes 1302 therein as shown in FIG. 1A. The 85% condition can decrease a length of the wall portion 140 so as to increase transparency of the micro light-emitting diode transparent display 100A compared to conventional displays. In the current manufacturing capability for commercial displays, a width (i.e., a lateral length L2 as will be shown later in FIGS. 3 and 4) of the wall portion 140 can only be decreased to about 20 μm to 30 μm, and also at least a portion of the wall portion 140 is set to absorb or reflect light (which will be exemplified later in FIGS. 3 and 4). That is why decreasing the length of the wall portion 140 can increase transparency of the micro light-emitting diode transparent display 100A.

FIG. 1A demonstrates that nine pixels 120A respectively include one set 130 therein, and each of the nine sets 130 respectively includes one, two, three, or four micro light-emitting diodes 1302 therein. However, a number of the micro light-emitting diodes 1302 in one set 130 is not limited to what is drawn in FIG. 1A. In some embodiments, each of the N sets 130 of the micro light-emitting diodes 1302 has at least three micro light-emitting diodes 1302. In some embodiments, the three micro light-emitting diodes 1302 are selected from red, green, blue, yellow, cyan, and UV micro light-emitting diodes. For example, the three micro light-emitting diodes 1302 can be red, green, and blue micro light-emitting diodes 1302, respectively. The three micro light-emitting diodes 1302 can also be three UV micro light-emitting diodes. In some other embodiments, there are five micro light-emitting diodes 1302 in one set 130 of the micro light-emitting diodes 1302. For example, the five micro light-emitting diodes 1302 can be red, green, blue, yellow, and cyan micro light-emitting diodes 1302, respectively.

In some other embodiments when the wall portion 140 does not fully enclose the set 130 of the micro light-emitting diodes 1302 in the X-Y plane, the periphery 1502 of the enclosed region 150 can be defined by the wall portion 140 and extensions 140' (illustrated by dotted lines in FIG. 2B) of the wall portion 140 as shown in FIG. 2B. The length of the wall portion 140 is more than half of a total length of the wall portion 140 and the extension 140'. The extensions 140' are straightly extended and connect the wall portion 140 to form a virtual enclosed border. The wall portion 140 and the extensions 140' of the wall portion 140 together can fully (and virtually) enclose the set 130 of the micro light-emitting diodes 1302 in the X-Y plane.

Reference is made to FIG. 1B. A difference between embodiments as illustrated by FIG. 1B and the embodiments as illustrated by FIG. 1A is that an outer periphery OP' of one pixel 120B of the embodiments as shown in FIG. 1B is in the shape of a hexagon, while the outer periphery OP of one pixel 120A of the embodiments as shown in FIG. 1A is in the shape of a tetragon. It is noted that shapes allowed to be used in the N pixels 120A/120B are those without any gap or space presence between two adjacent pixels 120A/120B when the N pixels 120A/120B are constructed. In some embodiments, the allowed shapes to be used in the N pixels 120A/120B are triangles, tetragons, and hexagons, but should not be limited thereto. Therefore, the outer periphery OP can be clearly defined by boundaries between one pixel 120A and four adjacent pixels 120A connecting said one pixel 120A as exemplified in FIG. 1A, and the outer periphery OP' can be clearly defined by boundaries between one pixel 120B and six adjacent pixels 120B connecting said one pixel 120B as exemplified in FIG. 1B.

Referring back to FIG. 1A, in some embodiments, an area 160 of said one of the N pixels 120A outside the enclosed region 150 substantially allows light to directly pass through the micro light-emitting diode transparent display 100A to increase the transparency of the micro light-emitting diode transparent display 100A. In some embodiments, an area of the enclosed region 150 is smaller than 72% of a value obtained by dividing a total area of the N pixels by N. Taking embodiments illustrated by FIG. 1A as an example, the enclosed region 150 can be one of the enclosed regions 150 as shown in FIG. 1A. The total area is a sum of areas of each of the pixels 120A. It is noted that the areas 160 are still respectively within the pixels 120A as shown in FIG. 1A. The 72% condition as mentioned also helps for increasing the transparency of the micro light-emitting diode transparent display 100A.

Figure 3:
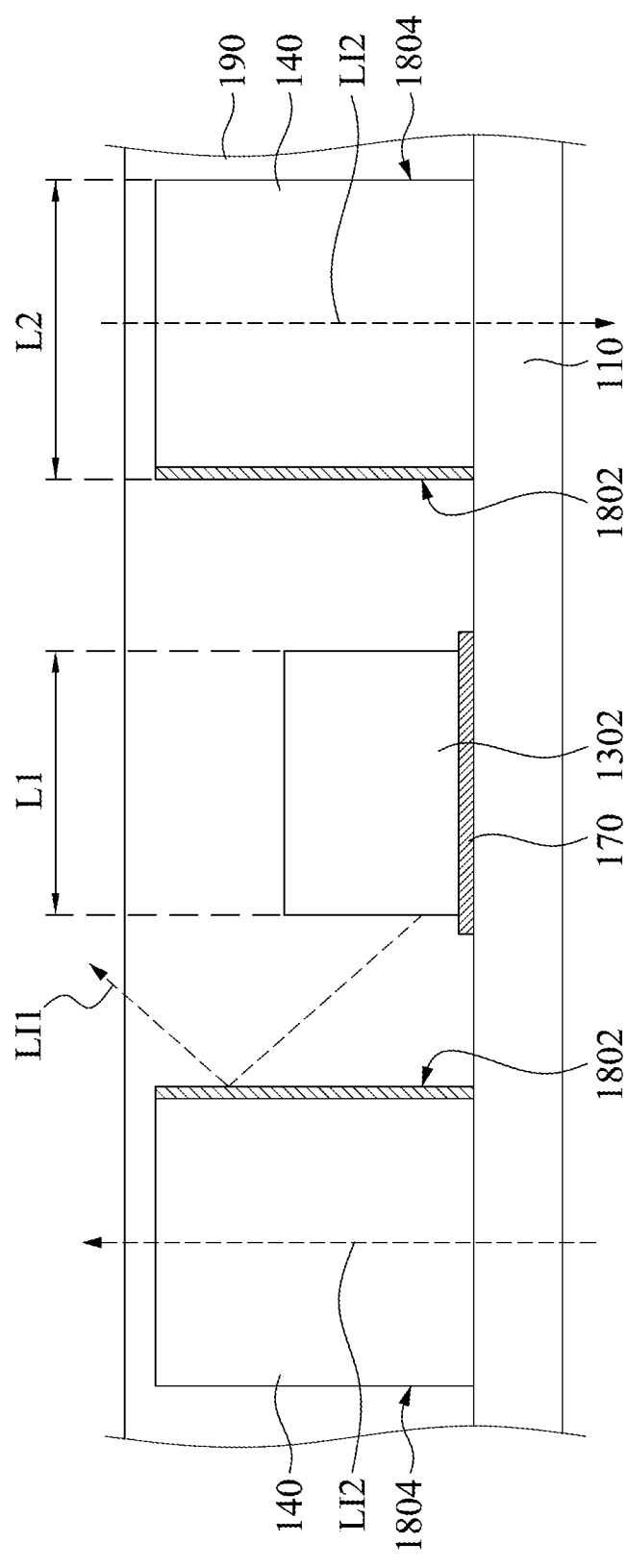
FIG. 3 is a schematic cross-sectional view of the micro light-emitting diode transparent display along line A-A' in FIG. 1A according to some embodiments of the present disclosure.

Reference is made to FIGS. 1A to 3. FIG. 3 is a schematic cross-sectional view of the micro light-emitting diode transparent display 100A along A-A' line in FIG. 1A according to some embodiments of the present disclosure. In some embodiments, a vertical projection of the wall portion 140 projected on the transparent substrate 110 is enclosed by the outer periphery OP of one of the N pixels 120A in which one set 130 of the micro light-emitting diodes 1302 is located.

The one set 130 of the micro light-emitting diodes 1302 is surrounded by the wall portion 140. In some embodiments, the vertical projection of the wall portion 140 projected on the transparent substrate 110 is enclosed by the area 160 of one of the N pixels 120A in which said one set 130 of the micro light-emitting diodes 1302 is located. In some embodiments, the outer periphery OP of said one of the N pixels 120A is not crossed over by the wall portion 140. In some embodiments, the wall portion 140 is not overlapped with the outer periphery OP from Z-axis. In some embodiments, the wall portion 140 does not in contact with the outer periphery OP.

Figure 4:
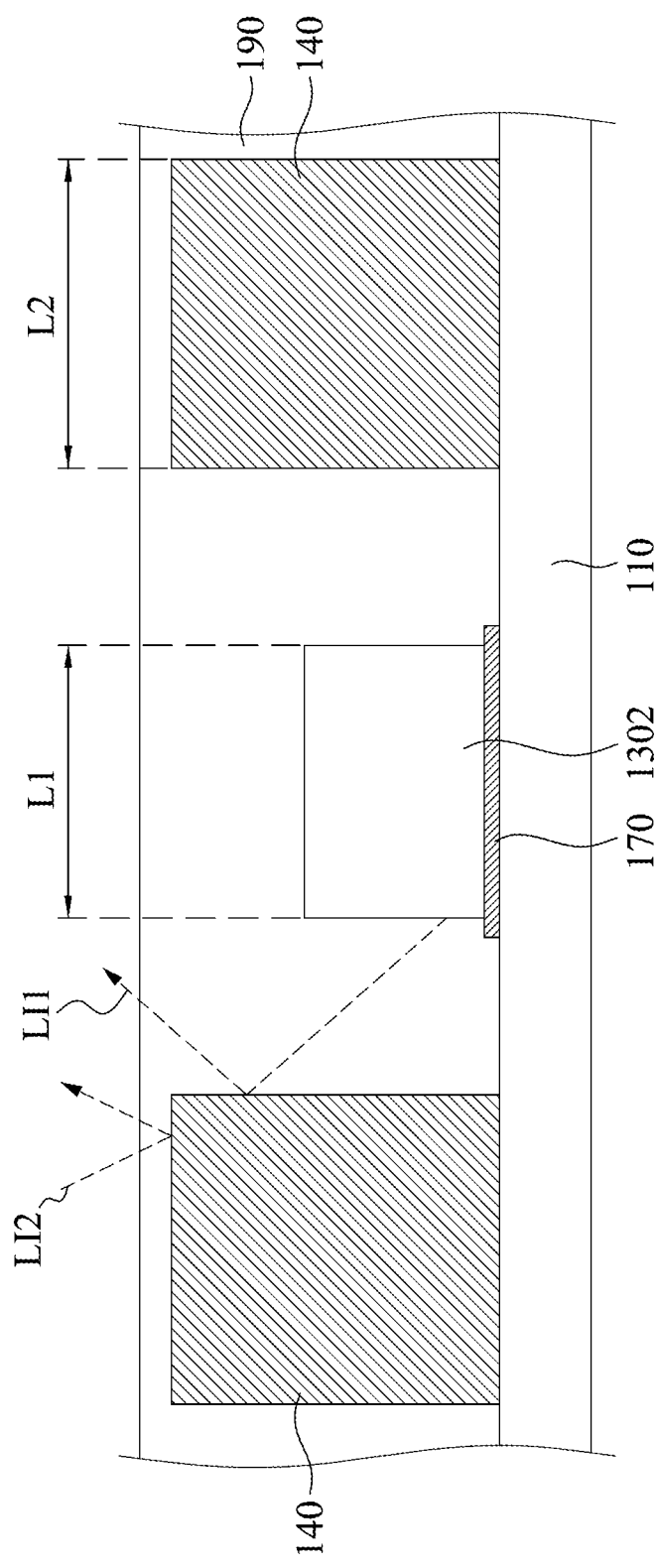
FIG. 4 is a schematic cross-sectional view of the micro light-emitting diode transparent display along line A-A' in FIG. 1A according to some other embodiments of the present disclosure.

Reference is made to FIGS. 3 and 4. FIG. 4 is a schematic cross-sectional view of the micro light-emitting diode transparent display 100A along A-A' line in FIG. 1A according to some other embodiments of the present disclosure. In some embodiments, a lateral length L1 of one of the micro light-emitting diodes 1302 is smaller than or equal to about 100 μm. That is to say, the conditions on the periphery 1502 and the area of the enclosed region 150 in the embodiments of the present disclosure is more suitable for the micro light-emitting diodes 1302 with the lateral length L1 smaller than or equal to about 100 μm, so as to achieve a significant increase of the transparency of the micro light-emitting diode transparent display 100A. Traditional displays cannot achieve this benefit because a lateral length of a light-emitting unit (e.g., a traditional light-emitting diode, but should not be limited thereto) is too large to allow the wall portion 140 to be freely arranged like the embodiments of the present disclosure.

In some embodiments, the micro light-emitting diode transparent display 100A (or the micro light-emitting diode transparent display 100B) further includes a light reflective layer 170 between one of the micro light-emitting diodes 1302 and the transparent substrate 110. The light reflective layer 170 can reflect light emitted from the micro light-emitting diode 1302 propagating downward to the light reflective layer 170. The light reflective layer 170 can form an electrical contact with the micro light-emitting diode 1302 an act as an electrode for the micro light-emitting diode 1302. In some embodiments, the light reflective layer 170 is a metal layer. In some embodiments, a side surface 1802 of the wall portion 140 is reflective. For example, the side surface 1802 facing the micro light emitting diode 1302 (i.e., an inner side surface of the wall portion 140) as shown in FIG. 3 is reflective, so as to reflect light LI1 emitted from the micro light-emitting diode 1302 to prevent a crosstalk (i.e. interference) of light LI1 between different pixels 120A (or different pixels 120B). Noted that a border which constitutes the periphery 1502 of the enclosed region 150 as mentioned before normally refers to an inner periphery of the wall portion 140 (i.e. a periphery made of the side surface 1802, or more precisely the inner side surface of the wall portion 140 as mentioned).

In some embodiments, a side surface 1804 of the wall portion 140 is transparent as shown in FIG. 3. Specifically, a portion of the wall portion 140 other than the side surface 1802 (i.e., the inner side surface) is transparent, such that light LI2 (e.g., ambient light, but should not be limited thereto) can pass through the portion of the wall portion 140 to increase the transparency of the micro light-emitting diode transparent display 100A and/or 100B. In some embodiments, the light LI2 is allowed to pass through the wall portion 140 in a direction perpendicular to a surface of the transparent substrate 110 (i.e., substantially along Z-axis) on which the N sets 130 of the micro light-emitting diodes 1302 are placed. In some embodiments, a filler 190 is on the wall portion 140 and fills empty space in the micro light-emitting diode transparent display 100A and/or 100B. In some embodiments, the filler 190 is transparent. In other embodiments as shown in FIG. 4, the wall portion 140 as shown in the embodiments illustrated in FIG. 4 is opaque. Specifically, the wall portion 140 as in the embodiments illustrated by FIG. 4 is light-reflective or light-absorbable as a whole. In some embodiments, the lateral length L2 of the wall portion 140 as shown in FIGS. 3 and 4 is about 20 μm to 30 μm, but should not be limited thereto.

Figure 5A:
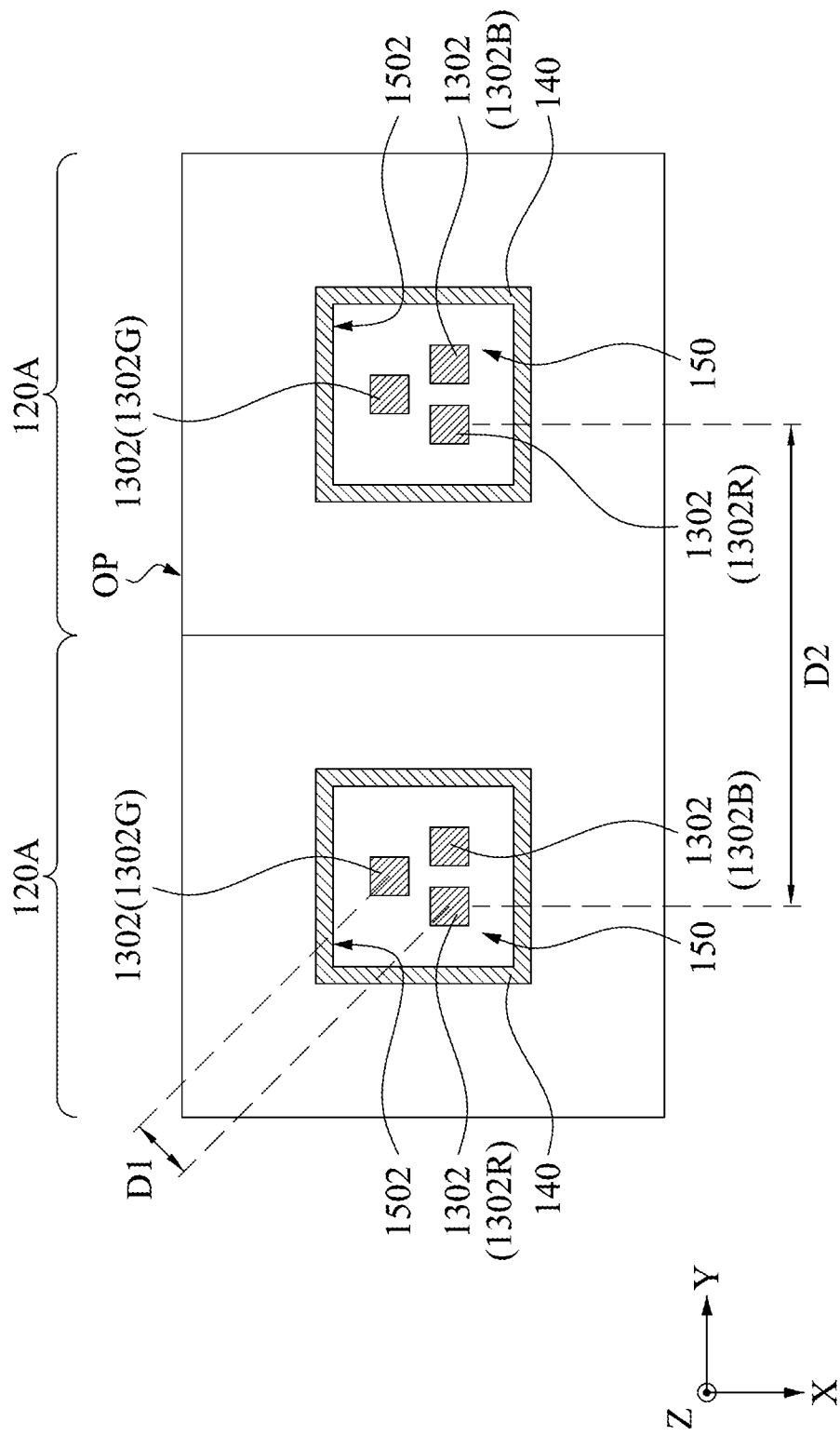
FIG. 5A is a schematic top view of two adjacent pixels of the micro light-emitting diode transparent display according to some embodiments of the present disclosure.
Figure 5B:
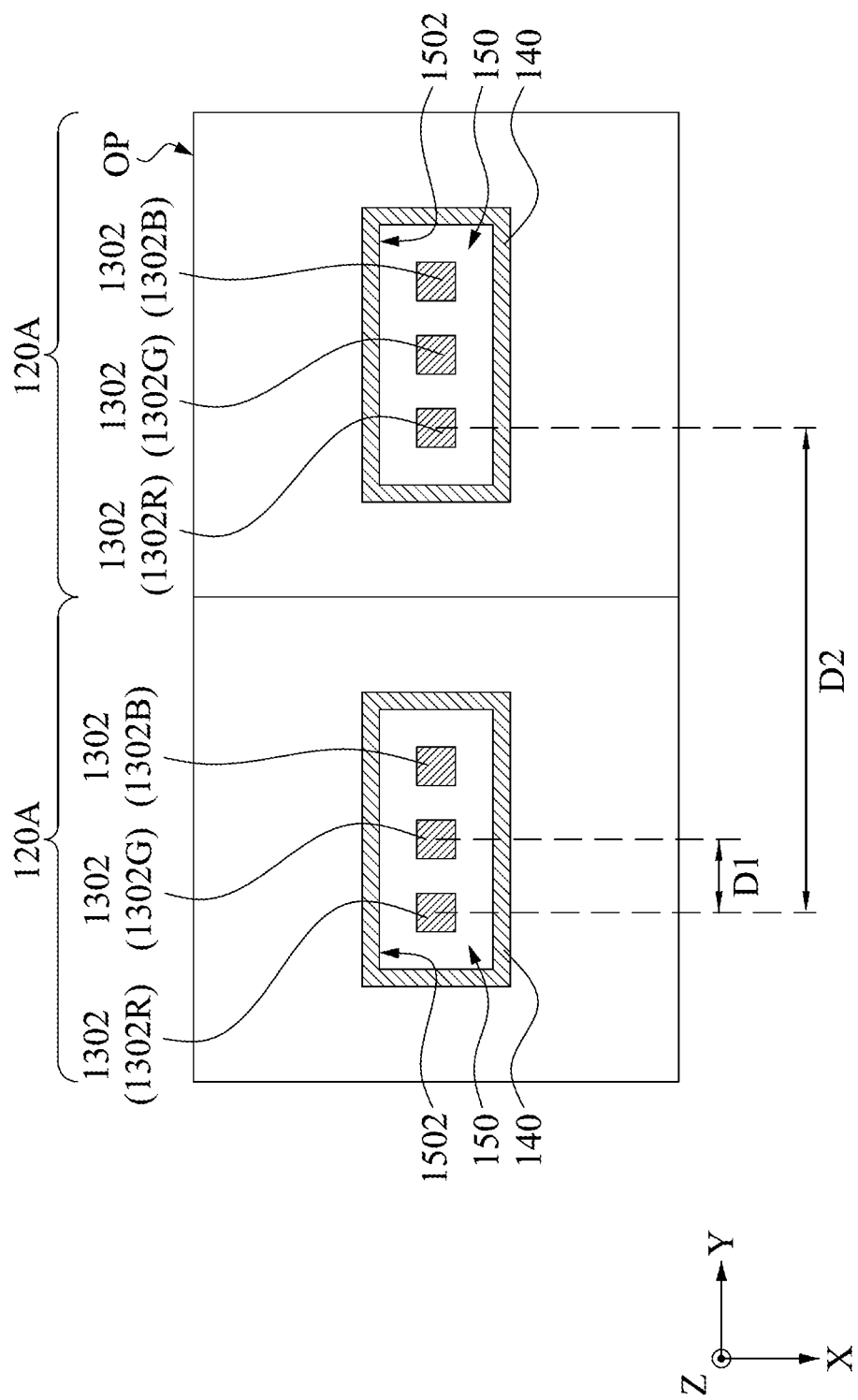
FIG. 5B is a schematic top view of two adjacent pixels of the micro light-emitting diode transparent display according to some other embodiments of the present disclosure.

Reference is made to FIGS. 5A and 5B. FIG. 5A is a schematic top view of two adjacent pixels 120A of the micro light-emitting diode transparent display 100A according to some embodiments of the present disclosure. FIG. 5B is a schematic top view of two adjacent pixels 120A of the micro light-emitting diode transparent display 100A according to some other embodiments of the present disclosure. In some embodiments, one of the N pixels 120A has M of the micro light-emitting diodes 1302 therein. M is a positive integer greater than or equal to 2. In some embodiments, the micro light-emitting diodes 1302 (i.e., the M micro light-emitting diodes 1302) have different emitting colors, and a distance between centers of adjacent two of the M of the micro light-emitting diodes 1302 within one of the N pixels 120A is smaller than 1/M of a distance between centers of two of the micro light-emitting diodes 1302 respectively in adjacent two of the N pixels which emit the same color.

Specific embodiments are shown in FIGS. 5A and 5B. In the embodiments illustrated by FIG. 5A, there are three (i.e., M=3) micro light-emitting diodes 1302 within one pixel 120A and enclosed by the wall portion 140. The micro light-emitting diodes 1302 are arranged in a shape of delta. A distance between centers of adjacent two of the three micro light-emitting diodes 1302 as mentioned is a distance D1. A distance between centers of two micro light-emitting diodes 1302 respectively in adjacent two pixels 120A which emit the same color is a distance D2. The distance D1 is smaller than one-third (i.e., 1/M=⅓) of the distance D2. It is noted that in some embodiments the micro light-emitting diodes 1302 within one pixel 120A emit different colors respectively. For example, the one in the lower left corner among three micro light-emitting diodes 1302 within one pixel 120A as shown in FIG. 5A is a red micro light-emitting diode 1302R. The one in the upper middle corner among three micro light-emitting diodes 1302 within said pixel 120A is a green micro light-emitting diode 1302G. The one in the lower right corner among three micro light-emitting diodes 1302 within said pixel 120A is a blue micro light-emitting diode 1302B. Therefore, the distance D2 as mentioned can be a distance between two red micro light-emitting diodes 1302R respectively within adjacent two pixels 120A as indicated in FIG. 5A. The distance D2 as mentioned can also be a distance between two green micro light-emitting diodes 1302G respectively within adjacent two pixels 120A, or between two blue micro light-emitting diodes 1302B respectively within adjacent two pixels 120A.

In addition, the distance D1 as mentioned can be a distance between the red micro light-emitting diode 1302R and the green micro light-emitting diode 1302G within one pixel 120A, between the red micro light-emitting diode 1302R and the blue micro light-emitting diode 1302B within one pixel 120A, or between the green micro light-emitting diode 1302G and the blue micro light-emitting diode 1302B within one pixel 120A. It is noted that embodiments illustrated by FIGS. 5A and 5B only demonstrate a case of M=3, however, M=2 or M>3 are also within the scope of the present disclosure, and will not be described in details herein.

In some other embodiments, when three micro light-emitting diodes 1302 within one pixel 120A emit the same wavelength (e.g., three UV micro light-emitting diodes 1302), the distance D2 can be a distance between two UV micro light-emitting diodes in the lower left corners (or the upper middle corners, or the lower right corners) respectively in two adjacent pixels 120A as mentioned. In the above embodiments in which the micro light-emitting diodes 1302 emit the same wavelength, there are at least one wavelength conversion layer (not explicitly shown in the figures of the present disclosure) on/above the UV micro light-emitting diodes 1302, such that at least two different wavelengths are emitted out from the pixel 120A. The wavelength conversion layer may include a quantum dot material or a phosphor material, but should not be limited thereto. In some embodiments, there are at least two types of wavelength conversion layers respectively above two of the UV micro light-emitting diodes 1302 in one pixel 120A.

A difference between the embodiments as illustrated by FIG. 5B and the embodiments as illustrated by FIG. 5A is that three micro light-emitting diodes 1302 in one pixel 120A are arranged in a shape of stripe as shown in FIG. 5B. A distance between centers of adjacent two of the three micro light-emitting diodes 1302 within one pixel 120A is the distance D1 (e.g., a distance between micro light-emitting diodes 1302R and 1302G as shown in FIG. 5B). A distance between centers of two micro light-emitting diodes 1302 in adjacent two pixels 120A which emit the same color is the distance D2. As shown in FIG. 5B, two micro light-emitting diodes 1302 respectively in the left sides respectively within two adjacent pixels 120A are red micro light-emitting diodes 1302R. Two micro light-emitting diodes 1302 respectively in the middle respectively within two adjacent pixels 120A are green micro light-emitting diodes 1302G. Two micro light-emitting diodes 1302 respectively in the right sides respectively within two adjacent pixels 120A are blue micro light-emitting diodes 1302B. In the embodiments as illustrated by FIG. 5B, the distance D1 is smaller than one-third (i.e., 1/M=⅓) of the distance D2.

Reference is made to FIG. 5C. FIG. 5C is a schematic top view of two adjacent pixels of a conventional display. As shown in FIG. 5C, the distance D1 is equal to one-third of the distance D2, which is different from the conditions (i.e., the distance D1 is smaller than one-third (i.e., 1/M=⅓) of the distance D2) in the embodiments as illustrated by FIGS. 5A and 5B. It is noted that in conventional displays, one pixel is equally divided into a red emitting unit R, a green emitting unit G, and a blue emitting unit B, thus causing the result where the distance D1 is equal to one-third of the distance D2 (assuming there are three different units within one pixel). On the other hand, since in the embodiments illustrated by FIGS. 5A and 5B a size (e.g., the lateral length L1, or an area) of one micro light-emitting diode 1302 is much smaller than one-third of a size of one pixel 120A, the condition that the distance D1 is smaller than one-third (i.e., 1/M=⅓) of the distance D2 can be achieved by centralizing three micro light-emitting diodes 1302 within said pixel 120A, so as to enhance a light mixing of the three micro light-emitting diodes 1302 within the pixel 120A.

In summary, embodiments of the present disclosure provide a micro light-emitting diode transparent display in which micro light-emitting diodes within one pixel are centralized. A wall portion surrounds the micro light-emitting diodes. The wall portion is distributed within and not along an outer periphery of the pixel so as to decrease a length of the wall portion. As such, not only an interference or crosstalk between adjacent pixels can be avoided, but also transparency of the micro light-emitting diode transparent display can be increased compared to conventional displays.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro light-emitting diode transparent display, comprising:
    a transparent substrate;
    N pixels defined on the transparent substrate, wherein N is a positive integer;
    N sets of micro light-emitting diodes on the transparent substrate and respectively located in the N pixels, each of the N sets of the micro light-emitting diodes having at least one micro light-emitting diode;
    a wall portion on the transparent substrate and surrounding one of the N sets of the micro light-emitting diodes to form an enclosed region on the transparent substrate such that said one of the N sets of the micro light-emitting diodes and the remaining of the N sets of the micro light-emitting diodes are on different sides of the wall portion, a length of a periphery of the enclosed region being equal to or smaller than 85% of a length of an outer periphery of one of the N pixels in which said one of the N sets of the micro light-emitting diodes is located, and an area of said one of the N pixels outside the enclosed region allowing ambient light to enter the micro light-emitting diode transparent display from one of opposite sides of the transparent substrate and then leave the micro light-emitting diode transparent display from another of the opposite sides, wherein the micro light-emitting diodes are on said one or said another of the opposite sides, wherein a side surface of the wall portion is opaque or light-absorbable; and
    a light reflective layer between one of the at least one micro light-emitting diode and the transparent substrate.

2. The micro light-emitting diode transparent display of claim 1, wherein an area of the enclosed region is smaller than 72% of a value obtained by dividing the total area of the N pixels by N.

3. The micro light-emitting diode transparent display of claim 1, wherein a lateral length of one of the micro light-emitting diodes is smaller than or equal to about 100 μm.

4. The micro light-emitting diode transparent display of claim 1, wherein each of the N sets of the micro light-emitting diodes has at least three micro light-emitting diodes.

5. The micro light-emitting diode transparent display of claim 4, wherein the three micro light-emitting diodes are selected from red, green, blue, yellow, cyan, and UV micro light-emitting diodes.

6. The micro light-emitting diode transparent display of claim 1, wherein a vertical projection of the wall portion projected on the transparent substrate is enclosed by the outer periphery of one of the N pixels in which said one of the N sets of the micro light-emitting diodes is located.

7. The micro light-emitting diode transparent display of claim 6, wherein the outer periphery of said one of the N pixels is not crossed over by the wall portion.

8. The micro light-emitting diode transparent display of claim 1, wherein the light reflective layer is a metal layer.

9. The micro light-emitting diode transparent display of claim 1, wherein one of the N pixels has M of said micro light-emitting diodes therein, the M of said micro light-emitting diodes have different emitting colors, and a distance between centers of adjacent two of the M of said micro light-emitting diodes is smaller than 1/M of a distance between centers of two of said micro light-emitting diodes in adjacent two of the N pixels which emit the same color, and M is a positive integer greater than or equal to 2.

10. The micro light-emitting diode transparent display of claim 1, wherein light is allowed to pass through the wall portion in a direction perpendicular to a surface of the transparent substrate on which the N sets of micro light-emitting diodes are placed.

* * * * *